US006909583B2

(12) United States Patent
Li et al.

(10) Patent No.: US 6,909,583 B2
(45) Date of Patent: Jun. 21, 2005

(54) FETA NANO-OXIDE LAYER IN PINNED LAYER FOR ENHANCEMENT OF GIANT MAGNETORESISTANCE IN BOTTOM SPIN VALVE STRUCTURES

(75) Inventors: Min Li, Fremont, CA (US); Simon H. Liao, Fremont, CA (US); Masashi Sano, Nagano (JP); Kiyoshi Noguchi, Nagano (JP); Kochan Ju, Fremont, CA (US); Cheng T. Horng, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 59 days.

(21) Appl. No.: 10/437,090

(22) Filed: May 13, 2003

(65) Prior Publication Data

US 2003/0192168 A1 Oct. 16, 2003

Related U.S. Application Data

(62) Division of application No. 10/037,812, filed on Jan. 4, 2002, now Pat. No. 6,581,272.

(51) Int. Cl.⁷ .............................................. G11B 5/127
(52) U.S. Cl. .................................................... 360/324.1
(58) Field of Search ..................... 360/324.1, 324.11, 360/324.12, 314, 319; 29/603.14; 428/632

(56) References Cited

U.S. PATENT DOCUMENTS

| | | | | |
|---|---|---|---|---|
| 5,287,238 A | * | 2/1994 | Baumgart et al. ............. 360/314 |
| 5,862,021 A | * | 1/1999 | Deguchi et al. .......... 360/324.11 |
| 6,122,150 A | | 9/2000 | Gill ........................... 360/324.11 |
| 6,141,191 A | * | 10/2000 | Lee et al. ................... 360/324.1 |
| 6,181,534 B1 | | 1/2001 | Gill ........................... 360/324.11 |
| 6,201,671 B1 | | 3/2001 | Pinarbasi ................... 360/324.11 |
| 6,208,491 B1 | | 3/2001 | Pinarbasi ..................... 360/324.1 |
| 6,219,208 B1 | | 4/2001 | Gill ............................... 360/324.1 |
| 6,222,707 B1 | | 4/2001 | Huai et al. .................. 360/324.1 |
| 6,292,336 B1 | * | 9/2001 | Horng et al. ............. 360/324.12 |
| 6,512,661 B1 | * | 1/2003 | Louis ......................... 360/324.12 |
| 6,556,390 B1 | * | 4/2003 | Mao et al. ................... 360/324.1 |
| 6,581,272 B1 | * | 6/2003 | Li et al. ..................... 29/603.14 |
| 6,729,014 B2 | * | 5/2004 | Lin et al. ................... 29/603.14 |
| 6,735,058 B2 | * | 5/2004 | Lin et al. ....................... 360/319 |
| 6,770,382 B1 | * | 8/2004 | Chang et al. ................. 428/632 |
| 6,773,515 B2 | * | 8/2004 | Li et al. .......................... 148/240 |

OTHER PUBLICATIONS

Swagten et al., "Specular Reflection in Spin Valves Bounded by NiO Layers," IEEE Tran. on Magnetics, vol. 34, No. 4, Jul. 1998, pp. 948–953.

Swagten et al., "Enhanced giant magnetoresistance in spin–valves sandwiched between insulating NiO," Physical Review B, vol. 53, No. 14, Apr. 1, 1966, pp. 9108–9114.

Y. Kamiguchi et al., "GFe Specular Spin Value GMR Head Using NOL in Pinned Layer," Paper DB–01, Digest of Inter–magnetic Conf. 1999.

J.C.S. Kools et al., "Magnetic Properties of Specular Spin–Valves Containing Name–Oxide Layers," Paper EB–11, Digest of MMM/Intermag. 2001 Conf., p. 262.

Y. Huai et al., "Highly Sensitive Spin–Valve Heads with Specular Thin Oxide Capping Layers," Paper EB–14, Digest of MMM/Intermag, 2001 Conf., p. 263.

* cited by examiner

*Primary Examiner*—Allen Cao
(74) *Attorney, Agent, or Firm*—George O'Saile; Stephen B. Ackerman

(57) ABSTRACT

A method for forming a bottom spin valve sensor having a synthetic antiferromagnetic pinned (SyAP) layer, antiferromagnetically coupled to a pinning layer, in which one of the layers of the SyAP is formed as a three layer lamination that contains a specularly reflecting oxide layer of FeTaO. The sensor formed according to this method has an extremely high GMR ratio and exhibits good pinning strength.

17 Claims, 1 Drawing Sheet

FIG. 1a – Prior Art

FETA NANO-OXIDE LAYER IN PINNED LAYER FOR ENHANCEMENT OF GIANT MAGNETORESISTANCE IN BOTTOM SPIN VALVE STRUCTURES

This is a division of patent application Ser. No. 10/037,812, filing date Jan. 4, 2002, now U.S. Pat. No. 6,581,272, Feta Nano-Oxide Layer In Pinned Layer For Enhancement Of Giant Magnetoresistance In Bottom Spin Valve Structures, assigned to the same assignee as the present invention.

BACKGROUND OF THE INVENTION

1. Field of the Invention

This invention relates generally to processes and materials used in the fabrication of a giant magnetoresistive (GMR) sensor, and more specifically to the use of a novel nano-oxide layer (NOL) in the pinned layer of a bottom spin valve sensor structure to improve its GMR ratio.

2. Description of the Related Art

One of the most commonly used structural configurations of magnetic and nonmagnetic layers in giant magnetoresistive (GMR) read-heads is the so-called spin-valve magnetoresistive (SVMR) structure. In the most basic version of the SVMR, two ferromagnetic layers such as CoFe or NiFe are separated by a thin layer of electrically conducting but non-magnetic material such as Cu. One of the layers has its magnetization direction fixed in space or "pinned," by exchange coupling with an antiferromagnetic (AFM) layer, usually a layer of MnPt, directly deposited upon it. The remaining ferromagnetic layer, the unpinned or free layer, can rotate its magnetization vector in response to small variations in external magnetic fields such as are produced by moving magnetic media, (which variations do not affect the magnetization direction of the pinned layer). The rotation of one magnetization relative to the other produces changes in the resistance (magnetoresistance) of the three layer structure, the changes being dependent on the cosine of the angle between the two magnetization vectors. As a result of these resistance variations, a constant "sense" current sent through the SVMR produces voltage variations across it, which are sensed by external circuitry. This effect of magnetization directions on electrical resistance is a result of spin dependent electron scattering, wherein the orientation of the electronic spins of the electrons in the sense current relative to the magnetization of the layer directly affects their scattering cross-sections and, consequently, the resistance of the magnetic material. An older version of magnetoresistance was the anisotropic magnetoresistive (AMR) effect, wherein the resistance of a magnetic material was found to depend upon the angle between its magnetization and the direction of a current through it. The discovery of ways to enhance the magnetoresistive effect by the use of two layers of magnetic material rather than one and by the methods used to form these layers, has led to what is now called the giant magnetorsistive (GMR) effect. It is this GMR which will be the subject of the present invention.

The major figure of merit for SVMR performance is its magnetoresistive ratio DR/R, which is a measure of the maximum variation of its resistance that can be expected in operation. Another factor influencing the performance of a SVMR is the thinness of its free layer, which is correlated to the signal amplitude it can provide for the signals it reads. Naturally, as magnetic recording densities become higher, with densities up to 70 $Gb/in^2$ envisioned in the near future, a very strong signal will be extremely important. The present invention, however, is directed at the improvement of the magnetoresistive ratio of a sensor, rather than the thinness of its free layer.

Improvements in the magnetoresistive ratio of a sensor element can be expected if the electrons in the sense current spend more time within the magnetically active portions of the sensor. For example, if the sensor element contains electrically conductive layers which do not directly contribute to the magnetoresistive effect (eg. they are not magnetic), then portions of the sense current may be shunted through these layers and not contribute to voltage variations across the sensor. It is now generally well accepted that a major contribution to the GMR effect is the presence of interfaces between various layers of the sensor elements. These interfaces produce specular reflection of the electrons, effectively removing mean-free-path limitations on electron scattering that would normally be placed on them by the external dimensions of the sensor. The realization of the importance of internal reflections on the magnetoresistive ratio, has produced great interest in the formation of sensor elements that exploit these interfacial scattering effects. For example, various types of capping layers, seed layers, buffer layers and nano-oxide layers (NOL) have been proposed as mechanisms for improving magnetorsistive ratios of sensor elements.

Huai et al. (U.S. Pat. No. 6,222,707 B1) teaches a method in which a seed layer is used to provide an improved texture for an antiferromagnetic layer grown upon it. The seed layer allows the growth of improved forms of antiferromagnetic pinning layers in bottom spin valves (spin valves in which the pinned layer is vertically beneath the free layer) thereby improving the exchange coupling between the pinning and pinned layers and, consequently, improving the magnetoresistive ratio.

Gill (U.S. Pat. No. 6,122,150) teaches a formation in which a synthetic antiparallel (SyAP) tri-layer is formed of two 20A layers of $Co_{90}Fe_{10}$ of mutually antiparallel magnetizations, separated by an 8 A layer of Ru. This tri-layer is exchange coupled to an antiferromagnetic pinning layer of 425 A of NiO. The high resistance of this formation restricts the amount of shunted sense current.

Gill (U.S. Pat. No. 6,219,208 B1) teaches the formation of a dual spin valve sensor having a self-pinned layer rather than a layer pinned by an antiferromagnetic pinning layer, thus eliminating that type of layer from the fabrication. The self pinning is accomplished by the magnetic field of the sense current. Because the elimination of the usual pinning layer also eliminates a source of specular reflection, a special specularly reflecting layer is formed over the self-pinned layer.

Gill (U.S. Pat. No. 6,181,534 B1) teaches a method for forming a magnetoresistive spin valve sensor element in which copper and nickel oxide specular rejection layers are formed on each other and over a free magnetic layer.

Pinarbasi (U.S. Pat. No. 6,201,671 B1) teaches the formation of bottom spin valve sensor that employs a TaO seed layer for a NiO antiferromagnetic pinning layer for the purpose of improving the magnetoresistive ratio of the sensor.

Pinarbasi (U.S. Pat. No. 6,208,491 B1) teaches the formation of a capping structure comprising layers of CoFe and Ta or, alternatively CoFe, Cu and Ta, which improves the magnetoresistive performance subsequent to long periods of time at high temperatures.

The literature also contains reports of magnetoresistive ratio improvements as a result of the inclusion of novel materials and structures in the fabrication of sensors. In this regard, Swagten et al., in "Specular Reflections in Spin Valves Bounded by NiO Layers," IEEE Transactions on Magnetics; Vol. 34, No. 4, July 1998, pp. 948–953, report on achieving increased electron reflectivity by an insulating NiO layer that is used to exchange bias a spin valve. Swagten et al., in "Enhanced giant magnetoresistance in spin-valves sandwiched between insulating NiO," Phys. Rev. B, Vol. 53, No. 14, 1 Apr. 1966 also report on the enhanced GMR effects obtained when sandwiching Co/Cu/Co and $Ni_{80}Fe_{20}/Cu/Ni_{80}Fe_{20}$ between layers of NiO.

Y. Kamiguchi et al., in "CoFe Specular Spin Valve GMR Head Using NOL in Pinned Layer," Paper DB-01, Digest of Intermagnetic Conference 1999, report on a spin valve structure in which the pinned layer contains a nano-oxide layer (NOL) which enhances specular electron scattering.

J. C. S. Kools, et al., in "Magnetic Properties of Specular Spin-Valves Containing Nano-Oxide Layers," Paper EB-11, Digest of MMM/Intermag. 2001 Conference, p. 262, discusses the specular reflection enhancing properties of NOL layers used in the free ferromagnetic layers and in the pinned ferromagnetic layers of spin valve structures using antiferromagnetic pinning layers.

Y. Huai et al., in "Highly Sensitive Spin-Valve Heads with Specular Thin Oxide Capping Layers," Paper EB-14, Digest of MMM/Intermag. 2001 Conference, p. 263, discuss the specular reflection enhancing effects of thin oxide capping layers used in bottom synthetic specular spin-valve structures.

The present invention provides a method of improving the GMR ratio of a bottom spin-valve structure while maintaining good pinning properties, by the insertion of a novel NOL material layer in its pinned layer.

SUMMARY OF THE INVENTION

It is an object of this invention is to provide a method for forming a bottom spin-valve sensor element having a higher GMR ratio than those formed by prior art methods, while retaining good pinning properties.

In accord with this object, There is provided a method for forming a bottom spin valve sensor element based on a NiCr seed layer, said method comprising the formation of a novel, specularly reflecting FeTaO nano-oxide layer within the pinned layer of the sensor element.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figure, wherein:

FIGS. 1a and 1b are schematic cross-sectional views of a bottom spin-valve sensor formed in accord with the prior art (1a) and in accord with the method of the present invention (1b).

DESCRIPTION OF THE PREFERRED EMBODIMENTS

Figure 1B:
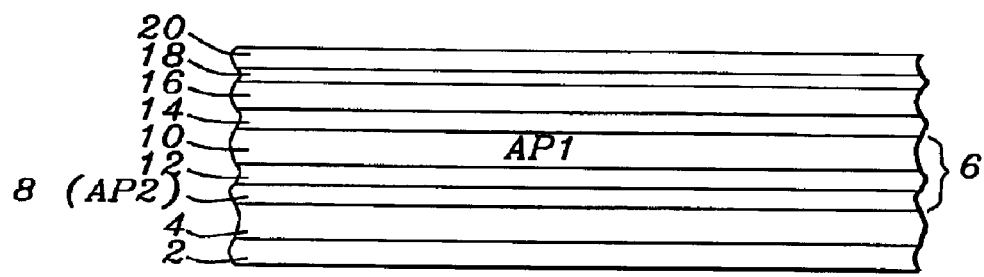
Figure 1B:
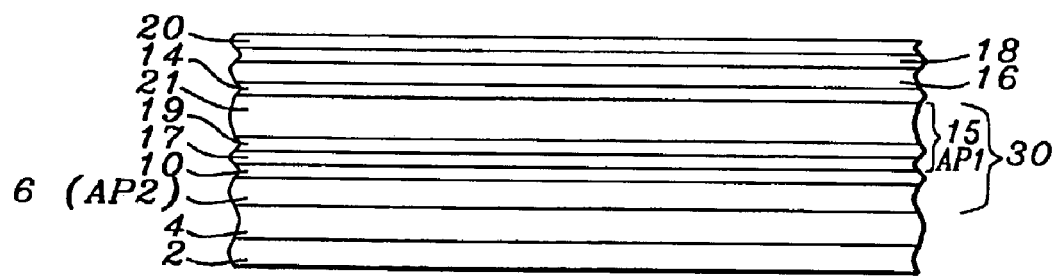

The present invention provides a method for fabricating a bottom spin-valve sensor element of high magnetoresistive ratio by forming a novel, specularly reflecting nano-oxide layer within its pinned layer.

Referring first to FIG. 1a, there is shown a schematic cross-sectional view of a typical prior art configuration of a bottom spin-filter element stack having a synthetic antiferromagnetically pinned (SyAP) layer. Compositionally, said stack has the form:

40A NiCr/130A MnPt/15A CoFe/8A Ru/20A CoFe/21A Cu/20A CoFe/5A Cu/8A Ta.

where "A" is angstroms.

As shown in FIG. 1a, the stack comprises an NiCr a seed layer (2) of approximately 40 angstroms thickness, an MnPt antiferromagnetic pinning layer (4) of approximately 130 angstroms thickness, a tri-layer formation of CoFe/Ru/CoFe (6), which is a synthetic pinned layer formed of two CoFe ferromagnetic layers (8) and (10), exchange coupled in mutually antiparallel magnetization directions through a Ru coupling layer (12) of approximately 8 angstroms thickness. CoFe layer (8) is denoted the second antiparallel layer, AP2, and is formed to a thickness of approximately 15 angstroms. CoFe layer (10) is denoted the first antiparallel layer, AP1, and is formed to a thickness of approximately 20 angstroms. The term "antiparallel" in this context refers to the mutually antiparallel directions of the magnetizations of the two pinned layers that corresponds to the low energy state between AP1 and AP2 when separated by a Ru layer of approximately 8 A. The "second" layer referred to in this context is the one contiguous with the antiferromagnetic pinning layer (4), whereas the "first" layer (10) is the one contiguous with the subsequently deposited Cu spacer layer (14). Said Cu spacer layer (14) is a non-magnetic spacer layer separating the pinned layer (6) from the free ferromagnetic layer (16), which is a CoFe layer deposited to a thickness of approximately 20 angstroms. A Cu layer (18) of approximate thickness 5 angstroms is formed on the free layer and a Ta layer (20) of approximate thickness 8 angstroms is formed on the Cu layer. Layers (18) and (20) provide a capping formation for the sensor stack.

Referring next to FIG. 1b, there is shown a schematic cross-sectional view of the new structure, compositionally described below, formed in accord with the method of the present invention.

40A NiCr/130A MnPt/15A CoFe/8A Ru/3A CoFe/5A FeTa//Ox//20A CoFe/21A Cu/20A CoFe/5A Cu/8A Ta.

As is shown schematically in FIG. 1b, the stack comprises an NiCr (or NiFeCr) seed layer (2) of approximately 40 angstroms thickness on which is formed an MnPt antiferromagnetic pinning layer (4) of approximately 130 angstroms thickness. In accord with the present invention, the SyAP is now formed as five layered laminate (30), comprising a second antiparallel (AP2) CoFe ferromagnetic layer (6) formed to a thickness of approximately 15 angstroms, on which is formed a non-magnetic Ru coupling layer (10) of approximately 8 angstroms thickness on which is formed a tri-layered first antiparallel (AP1) layer (15). The AP1 and AP2 terminology is the same as that used in describing FIG. 1a. The AP1 layer (15), which in the prior art is a single CoFe layer (see layer (10) in FIG. 1a), is now formed as a tri-layer, comprising a layer of CoFe (17) of approximately 3 angstroms thickness, to maintain strong magnetic coupling between AP1/AP2 since CoFe/Ru/FeTa coupling is weak, on which CoFe layer is then formed a specularly reflecting FeTaO layer (19) of approximately 5 angstroms thickness, on which is formed a layer of CoFe (21) of approximately 20 angstroms thickness. The FeTaO layer is formed as a deposited FeTa layer which is approximately 95% Fe by atomic weight and approximately 5% Ta by atomic weight, which is subsequently oxidized in either of the following processes in a PM5 TIM module.

Ox1: 50 sccm $O_2$ flow rate (0.5 mTorr)×10 sec.

Ox2: 75 sccm $O_2$ flow rate (0.75 mTorr)×10 sec.

Ox3: 100 seem $O_2$ flow rate (1.0 mTorr)×10 sec.

Subsequent to the oxidation of the CoFe layer (21), there is formed a non-magnetic spacer layer (14), which is a layer of Cu formed to a thickness of approximately 21 angstroms and which separates the SyAP layer from the ferromagnetic free layer. That ferromagnetic free layer (16) is then formed on the Cu spacer layer as a layer of CoFe of approximately 20 angstroms thickness. Upon said free layer there is then formed a Cu oxidation barrier layer (18) of approximately 5 angstroms thickness, upon which is then formed a specular scattering layer Ta layer (20) of approximately 8 angstroms thickness. Although serving different purposes, the Cu/Ta layer is denoted a capping Layer.

Subsequent to the formation of the element as above, the magnetizations of the various layers are established through a three step thermal anneal in the presence of external magnetic fields as follows:

1: 270° C./1 kOe/10 min., for the free layer, the field being longitudinally directed.
2: 270° C./8 kOe/3 hr., for the pinned layer, with the field being in the transverse direction.
3: 210° C./200 Oe/2 hr., for the free layer, the field being longitudinally directed.

Experiments performed on sensor stacks formed in accord with the methods of the prior art and on sensor stacks formed in accord with the method of the present invention show a distinct improvement in the magnetoresistive properties of the latter stacks as compared with the former. Table 1 below compares DR/R and DR for a reference prior art stack (row 1) and stacks formed using the method of the present invention for each of the three oxidation processes described above (rows 2, 3, 4 respectively).

TABLE 1

|  | DR/R(%) | DR(Ohm/sq) |
|---|---|---|
| NiCr40/MnPt130/CoFe15/Ru8/CoFe20/Cu21/CoFe20/Cu5/Ta8 | 14.00 | 2.39 |
| NiCr40/MnPt130/CoFe15/Ru8/CoFe3/FeTa5/OX1/CoFe20/Cu21/CoFe20/Cu5/Ta8 | 15.16 | 2.67 |
| NiCr40/MnPt130/CoFe15/Ru8/CoFe3/FeTa5/OX2/CoFe20/Cu21/CoFe20/Cu5/Ta8 | 15.96 | 2.89 |
| NiCr40/MnPt130/CoFe15/Ru8/CoFe3/FeTa5/OX3/CoFe20/Cu21/CoFc20/Cu5/Ta8 | 15.16 | 2.68 |

All numerical values in the stack formations above are in angstroms. It can be seen from the experimental results that the enhancement of DR/R and DR is a maximum of 14% and 21% respectively for the OX2 sample. Testing of hysteresis loops for the above samples also shows that the loops of the FeTaO samples are comparable to those of the reference samples indicating that sensor stacks formed in accord with the method of the present invention display strong coupling between the pinned and pinning layers.

Experimental and theoretical considerations lead us to conclude that the DR/R and DR improvements are a result of the improved specular reflection of conduction electrons provided by the FeTaO layer in the AP1 layer of the pinned layer.

As is understood by a person skilled in the art, the preferred embodiment of the present invention is illustrative of the present invention rather than limiting of the present invention. Revisions and modifications may be made to methods, materials, structures and dimensions employed in practicing the method of the present invention, while still remaining in accord with the spirit and scope of the present invention as defined by the appended claims.

What is claimed is:

1. A bottom spin valve magnetoresistive sensor element comprising:

a substrate;
a magnetoresistive-property-enhancing seed layer formed on the substrate;
a pinning layer of antiferromagnetic material formed on the seed layer;
a synthetic antiferromagnetic pinned (SyAP) layer, further comprising:
  a second antiparallel (AP2) pinned layer of ferromagnetic material formed on the pinning layer;
  a non-magnetic coupling layer formed on said AP2 layer; and
  a first antiparallel (AP1) pinned layer formed on said non-magnetic coupling layer, said first antiparallel pinned layer comprising a first ferromagnetic layer on which is formed a specular reflection enhancing layer on which is formed a second ferromagnetic layer;
a non-magnetic spacer layer formed on said second ferromagnetic layer;
a ferromagnetic free layer formed on said non-magnetic spacer layer;
a double-layer capping layer formed on said ferromagnetic free layer, said capping layer comprising a first layer of non-magnetic material on which is formed a second layer of non-magnetic material.

2. The sensor of claim 1 wherein the seed layer is a layer of either NiCr or NiFeCr deposited to a thickness of between approximately 30 and 70 angstroms.

3. The sensor of claim 1 wherein the antiferromagnetic pinning layer is a layer of antiferromagnetic material chosen from the group consisting of MnPt, IrMn, NiMn and MnPtPd.

4. The sensor of claim 1 wherein the antiferromagnetic pinning layer is a layer of MnPt formed to a thickness of between 80 and 250 angstroms.

5. The sensor of claim 1 wherein the second antiparallel pinned layer (AP2) is a layer of ferromagnetic material chosen from the group consisting of CoFe, NiFe and CoFeNi.

6. The sensor of claim 5 wherein the second antiparallel pinned layer (AP2) is a layer of CoFe formed to a thickness of between 10 and 25 angstroms.

7. The sensor of claim 1 wherein the non-magnetic coupling layer is a layer of non-magnetic material chosen from the group consisting of Ru, Rh and Re.

8. The sensor of claim 7 wherein the non-magnetic coupling layer is a layer of Ru formed to a thickness of between approximately 3 and 9 angstroms.

9. The sensor of claim 1 wherein the first ferromagnetic layer of said first antiparallel pinned layer (AP1) is a layer of ferromagnetic material chosen from the group consisting of CoFe, NiFe and CoFeNi.

10. The sensor of claim 9 wherein the first ferromagnetic layer is a layer of CoFe formed to a thickness of between approximately 2 and 10 angstroms.

11. The sensor of claim 1 wherein the specularly reflecting layer is a layer of FeTaO formed to a thickness of between approximately 3 and 10 angstroms.

12. The sensor of claim 1 wherein the second ferromagnetic layer of said first antiparallel pinned layer (AP1) is a layer of ferromagnetic material chosen from the group consisting of CoFe, NiFe and CoFeNi.

13. The sensor of claim 12 wherein the second ferromagnetic layer of said first antiparallel pinned layer (AP1) is a layer of CoFe formed to a thickness of between approximately 10 and 30 angstroms.

14. The sensor of claim 1 wherein the non-magnetic spacer layer is a layer chosen from the group consisting of Cu, Ag and Au.

15. The sensor of claim 14 wherein the non-magnetic spacer layer is a layer of Cu of thickness between approximately 8 and 30 angstroms.

16. The sensor of claim 1 wherein the capping layer comprises a layer of Cu formed to a thickness of between approximately 3 and 20 angstroms on which is formed a layer of Ta, formed to a thickness of between approximately 3 and 30 angstroms.

17. The sensor of claim 1 wherein the layers AP1 and AP2 are longitudinally magnetized in mutually antiparallel directions that are transverse to the magnetization of the free layer.

* * * * *